United States Patent
Ishida et al.

(10) Patent No.: US 8,089,096 B2
(45) Date of Patent: Jan. 3, 2012

(54) FIELD EFFECT TRANSISTOR WITH MAIN SURFACE INCLUDING C-AXIS

(75) Inventors: Hidetoshi Ishida, Osaka (JP); Masayuki Kuroda, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 174 days.

(21) Appl. No.: 11/470,316

(22) Filed: Sep. 6, 2006

(65) Prior Publication Data

US 2007/0057290 A1 Mar. 15, 2007

(30) Foreign Application Priority Data

Sep. 9, 2005 (JP) .................................. 2005-262858

(51) Int. Cl.
*H01L 29/778* (2006.01)
*H01L 29/04* (2006.01)
(52) U.S. Cl. ................ 257/192; 257/628; 257/E29.246
(58) Field of Classification Search .................. 257/190, 257/192, 196, 213, 627, 628, E29.246
See application file for complete search history.

(56) References Cited

U.S. PATENT DOCUMENTS

| | | | |
|---|---|---|---|
| 6,329,677 B1 | 12/2001 | Oguri et al. | |
| 6,441,391 B1 | 8/2002 | Ohno et al. | |
| 6,465,814 B2 | 10/2002 | Kasahara et al. | |
| 2002/0017648 A1 | 2/2002 | Kasahara et al. | |
| 2002/0047113 A1 | 4/2002 | Ohno et al. | |
| 2003/0198837 A1* | 10/2003 | Craven et al. | 428/698 |
| 2003/0218183 A1* | 11/2003 | Micovic et al. | 257/192 |
| 2006/0175618 A1 | 8/2006 | Ishida | |
| 2006/0261371 A1 | 11/2006 | Kuroda et al. | |

FOREIGN PATENT DOCUMENTS

| | | |
|---|---|---|
| JP | 11-341825 | 12/1999 |
| JP | 2000-150535 | 5/2000 |
| JP | 2001-160656 | 6/2001 |
| JP | 2002-16245 | 1/2002 |
| JP | 2002-76329 | 3/2002 |
| JP | 2002-374003 | 12/2002 |

(Continued)

OTHER PUBLICATIONS

Ng, H.M., "Molecular-beam epitaxy of GaN/AlxGax-1N multiple quantum wells on R-plane (1012) sapphire substrates," Applied Physics Letters, vol. 80, No. 23 (Jun. 10, 2002), pp. 4369-4371.*

(Continued)

*Primary Examiner* — Anh Phung
*Assistant Examiner* — Allison P Bernstein
(74) *Attorney, Agent, or Firm* — Greenblum & Bernstein, P.L.C.

(57) ABSTRACT

A normally-off type field effect transistor includes: a first semiconductor layer which is made of a first hexagonal crystal with 6 mm symmetry and has a main surface including a C-axis of the first hexagonal crystal; a second semiconductor layer which is formed on the main surface of the first semiconductor layer and is made of a second hexagonal crystal with 6 mm symmetry having a band gap different from a band gap of the first hexagonal crystal; and a gate electrode, a source electrode and a drain electrode that are formed on the second semiconductor layer. Here, the film thickness of the first nitride semiconductor layer is 1.5 μm or less and the second semiconductor layer is doped with impurities at a dose of $1 \times 10^{13}$ cm$^{-2}$ or more.

24 Claims, 10 Drawing Sheets

FOREIGN PATENT DOCUMENTS

JP      2005-285869      10/2005

OTHER PUBLICATIONS

Ambacher et al., "Two-dimensional electron gases induced by spontaneous and piezoelectric polarization charges in N- and Ga-face AlGaN/GaN heterostructures," Journal of Applied Physics, vol. 85, No. 6 (Mar. 15, 1999), pp. 3222-3233.

English language Abstract of JP 2001-160656.

English language Abstract of JP 11-341825.

Japan Office action, mailed Oct. 18, 2011.

\* cited by examiner

In the case where GaN grows on sapphire R plane

| | Lattice spacing in GaN (-1100) direction (Å) | |
|---|---|---|
| GaN layer | 2.76 | |
| AlN layer | 2.69 | Sequentially increased |
| Sapphire substrate | 2.38 | |

In the case where GaN grows on sapphire C plane

| | Lattice spacing in GaN (11-20) direction | Lattice spacing in GaN (-1100) direction |
|---|---|---|
| GaN layer | 3.19 | 2.76 |
| AlN layer | 3.11 | 2.69 |
| Sapphire substrate | 4.12 | 4.76 |

| Process | Resistance $R_{oh}(\Omega)$ in ohmic region | Channel resistance $R_{ch}(\Omega)$ | On resistance $R_{on}(\Omega)$ | Reduction effect (%) |
|---|---|---|---|---|
| No n⁻layer 180 and n⁺layer 181 | 2.3 | 5.2 | 9.8 | — |
| With n⁻layer 180, No n⁺layer 181 | 2.3 | 4.1 | 8.7 | -11 |
| With n⁻layer 180 and n⁺layer 181 | 1.84 | 4.1 | 7.78 | -21 |

FIELD EFFECT TRANSISTOR WITH MAIN SURFACE INCLUDING C-AXIS

BACKGROUND OF THE INVENTION (1) Field of the Invention

The present invention relates to a nitride electronic device intended for power switching as represented by an inverter used for an electric vehicle or a home electric appliance.

(2) Description of the Related Art

Recently, a nitride semiconductor has been under intense research and development as a material for high-output devices.

A Modulation Doped Field Effect Transistor (MODFET) applying an aluminum gallium nitride/gallium nitride (AlGaN/GaN) heterojunction is being studied as an electronic device. The most significant difference between such MODFET and a gallium arsenide (GaAs) MODFET is that the former MODFET can realize a sheet carrier concentration ten times as much as that of the GaAs MODFET without doping, with impurities, an AlGaN layer which is a Schottky layer. The mechanism of carrier generation is that two-dimensional electrons are accumulated in an interface between AlGaN and GaN, which is caused by a polarization generated due to a piezo effect in the AlGaN layer because of the stress between AlGaN and GaN due to the lattice mismatch. Therefore, stress is a very important parameter for the MODFET applying the AlGaN/GaN heterojunction, and thus the relationship between the sheet carrier concentration and the stress between AlGaN and GaN is vigorously being researched. For example, sheet carrier concentration of two-dimensional electron gas is quantitatively calculated based on stress, as described by O. Ambacher et al. in Journal of Applied Physics (1999), Vol. 85, pp. 3222-3233.

As is represented by the example shown in the above-mentioned reference by O. Ambacher et al., the conventional AlGaN/GaN heterojunction is formed by stacking layers in a direction of C-axis. This is because, with such formation of heterojunction, namely, with the formation of an AlGaN/GaN heterojunction having a C-plane, the effect of polarization unique to the nitride semiconductor can be obtained.

In contrast, Japanese Laid-Open Patent Application No. 2001-160656 (hereinafter, referred to as Patent Reference 1) discloses a field effect transistor (FET) in which an A-plane or an structure is used as a main surface of a substrate and a direction of current is made vertical to the C-axis. With such FET, a dispersion of carriers due to dislocation is suppressed so that the FET with excellent electric characteristics can be realized.

SUMMARY OF THE INVENTION

Although the conventional AlGaN/GaN heterojunction having the C-plane can realize a high sheet carrier concentration due to its large polarization effect, it is difficult to effectively dope a semiconductor with impurities. In other words, an amount of carriers generated by the polarization overwhelmingly increases so that it is difficult to give an accurate carrier profile through doping. Therefore, with the MODFET applying the AlGaN/GaN heterojunction having the C-plane for example, it is possible, on one hand, to increase breakdown voltage and saturation threshold current by material characteristics of a nitride semiconductor. On the other hand, the problem is that it is difficult to control pinch-off voltage. Accordingly, it is very difficult to manufacture, in particular, a normally-off type FET.

The Patent Reference 1 discloses the FET applying a heterojunction having an A-plane or an M-plane. However, in the case where a nitride semiconductor layer having the A-plane or M plane as a main surface is formed, the surface morphology of the nitride semiconductor layer is deteriorated. Furthermore, carrier mobility in the nitride semiconductor layer having the A-plane or M-plane is low. Therefore, the drain current of the FET applying a heterojunction having the A-plane or M-plane is very small so that good device characteristics cannot be obtained.

Accordingly, the present invention is conceived in view of the above problem, and an object of the present invention is to provide a normally-off type FET.

Regarding the aforementioned object, the inventors of the present invention et al. have examined a device structure using a surface including a C-axis of a hexagonal crystal with 6 mm symmetry, which does not cause polarization, in the FET made of the hexagonal crystal with 6 mm symmetry such as a nitride semiconductor material. As a result of examinations from a crystal growth to a process of a device, with respect to the expitaxial growth, the inventors et al. have demonstrated, for the first time in the world, doping characteristics and a growth mechanism which are totally different from the conventionally known growth of the C-plane. Furthermore, they have clarified that a device structure which is different from the conventional structure is necessary in order to realize a normally-off type field effect transistor using such epitaxial film. These findings led the inventors to the present invention.

In order to achieve the aforementioned object, a semiconductor device of the present invention includes: a first semiconductor layer which is made of a first hexagonal crystal with 6 mm symmetry and has a main surface including a C-axis of the first hexagonal crystal; a second semiconductor layer which is formed on the main surface of the first semiconductor layer and is made of a second hexagonal crystal with 6 mm symmetry having a band gap different from a band gap of the first hexagonal crystal; and a gate electrode, a source electrode, and a drain electrode that are formed on the second semiconductor layer Here, a film thickness of the first semiconductor layer is 1.5 µm or less.

With such structure, a heterojunction having a plane including the C-axis is formed instead of the conventional heterojunction having the C-plane so that the polarization problem unique to the C-plane is resolved. As a result, very highly concentrated piezo charge is not generated in the heterojunction. Therefore, a FET which can precisely control the carrier concentration can be realized. In other words, a precise carrier profile can be given as a result of impurity doping so that a normally-off type FET can be realized.

Furthermore, based on the findings from detailed experiments carried out by the inventors et al., in the case where the first semiconductor layer is made of a hexagonal crystal with 6 mm symmetry, in the crystal growth of the first semiconductor layer having, as a main surface, a plane including the C-axis such as a (11-20) plane, streaked surface morphology is apparently generated when the film thickness of the first semiconductor layer is 1.5 µm or greater. In the end, this causes the surface to fog, decreasing the drain current of the FET using the first semiconductor layer. This phenomenon results from the crystal growth mechanism of the semiconductor layer having a plane including the C-axis as the main surface. Therefore, the decrease in the drain current in the FET can be prevented without receiving the influence of the crystal growth mechanism by making the film thickness of the first semiconductor layer be 1.5 µm or less.

Furthermore, the second semiconductor layer may be doped with impurities at a dose of $1\times10^{13}$ cm$^{-2}$ or more.

From the findings obtained from the detailed experiments carried out by the inventors et al., it is obvious that, in the crystal growth of the first semiconductor layer having, as a main surface, a plane including the C-axis such as a (11-20) plane, the impurity doping characteristic of the semiconductor layer is different from that of the conventional semiconductor layer having the C-plane as the main surface. In other words, it is characterized in that carrier mobility is decreased in the semiconductor layer having, as a main surface, the plane including the C-axis. Accordingly, the decrease in drain current in the FET can be prevented by doping the second semiconductor layer with impurities at a dose amount of $1\times10^{13}$ (cm$^{-2}$).

Furthermore, a length direction of the gate electrode may be orthogonal to the C-axis.

With such structure, stress is generated in a direction vertical to the length direction of the gate electrode, and positive and negative types of piezo charge are generated locally in portions positioned below the sides of the gate electrode. Consequently, the speed of electrons which run a channel is accelerated due to the polarized charge so that a high-speed FET can be realized.

Furthermore, based on the findings obtained from the detailed experiments carried out by the inventors et al., in the crystal growth of the semiconductor layer having, as a main surface, a plane including the C-axis such as a (11-20) plane as a main surface, the streaked surface morphology which runs toward the C-axis is formed on the surface of the semiconductor layer. The electrons are scattered when the electrons run vertically to the streaks so that the carrier mobility is reduced. Accordingly, the reduction in carrier mobility can be prevented by making the length direction of the gate electrode be orthogonal to the C-axis direction and making the direction toward which electrons run be parallel to the streaks.

Additionally, the field effect transistor further includes: a sapphire substrate having an R-plane as a main surface; and an AlN layer which is formed between the first semiconductor layer and the sapphire substrate so that the AlN layer is to be positioned on the main surface of the sapphire substrate, wherein the second semiconductor layer may be a GaN layer.

With such structure, the lattice spacing in the (−1100) direction is increased in order of a substrate, an AlN layer and a first semiconductor layer so that the lattice mismatch in the (−1100) direction is decreased. As a result, the crystallinity of the first semiconductor layer can be significantly improved. Note that, it is obvious that this effect cannot be obtained with the structure in which an AlN layer and a GaN layer are stacked on the C-plane of the sapphire substrate.

Furthermore, the second semiconductor layer has an n-type conductivity, and first n-type regions may be formed in a region of the second semiconductor layer other than a region of the second semiconductor layer immediately below the gate electrode, as a result of implanting ions of n-type impurities.

With such structure, an impurity doping which will not be obtained by the epitaxial growth can be realized. Consequently, relatively high channel resistance can be reduced. For example, on-resistance of the FET can be reduced by about ten percent.

Furthermore, second n-type regions may be formed in a region of the first n-type regions immediately below the source electrode and the drain electrode.

With such structure, the contact resistance of the source electrode and the drain electrode car be reduced. For example, the contact resistance can be improved by ten percent, which results in the reduction in the on-resistance by about twenty percent.

Furthermore, the field effect transistor may have a recess structure.

With such structure, the relatively large on-resistance can be significantly reduced. Furthermore, the speed of electrons which run through a channel can be accelerated due to the charge polarized on the recess side walls. Accordingly, a high-speed FET can be realized.

Furthermore, the second semiconductor layer may have an n-type conductivity, and a portion of said first semiconductor layer may be doped with n-type impurities.

With such structure, the impurities in the first semiconductor layer also contribute to the supply of electrons. Therefore, the drain current in the FET can be increased.

Furthermore, the present invention may be a field effect transistor which includes: a first semiconductor layer which is made of a first hexagonal crystal with 6 mm symmetry and has a main surface including a C-axis of the first hexagonal crystal; a second semiconductor layer which is formed on the main surface of the first semiconductor layer and is made of a second hexagonal crystal with 6 mm symmetry having a band gap different from a band gap of the first hexagonal crystal; and a gate electrode, a source electrode, and a drain electrode that are formed on said second semiconductor layer. Here, the second semiconductor layer is doped with impurities at a dose of $1\times10^{13}$ cm$^{-2}$ or more.

With such structure, a FET which can precisely control the carrier concentration can be realized. Specifically, a precise carrier profile can be given as a result of impurity doping so that a normally-off type FET can be realized.

Furthermore, the decrease in drain current in the FET can be prevented by doping the second semiconductor layer with impurities at a dose of $1\times10^{13}$ cm$^{-2}$.

Furthermore, a film thickness of the first semiconductor layer may be 1.5 µm or less.

With such structure, the decrease in drain current in the FET can be prevented by making the film thickness of the first semiconductor layer be 1.5 µm or less.

As described in the above, according to the FET of the present invention, a FET, which can precisely control the carrier concentration without receiving an influence of a very highly concentrated polarized charge, can be realized. Consequently, the threshold voltage of the FET can be easily controlled and a good normally-off type FET can be realized.

Accordingly, the present invention can provide a FET which has both characteristics of a material characteristic of a nitride semiconductor namely a high resistance characteristic and a normally-off type characteristic demanded in the market. The practical value of the present invention is thus very high.

As further information about technical background to this application, the disclosure of Japanese Patent Application No. 2005-262858 filed on Sep. 9, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention, In the drawings.

DESCRIPTION OF THE PREFERRED EMBODIMENTS

The following describes a semiconductor device according to the embodiments of the present invention, with reference to the drawings.

First Embodiment

Figure 1:
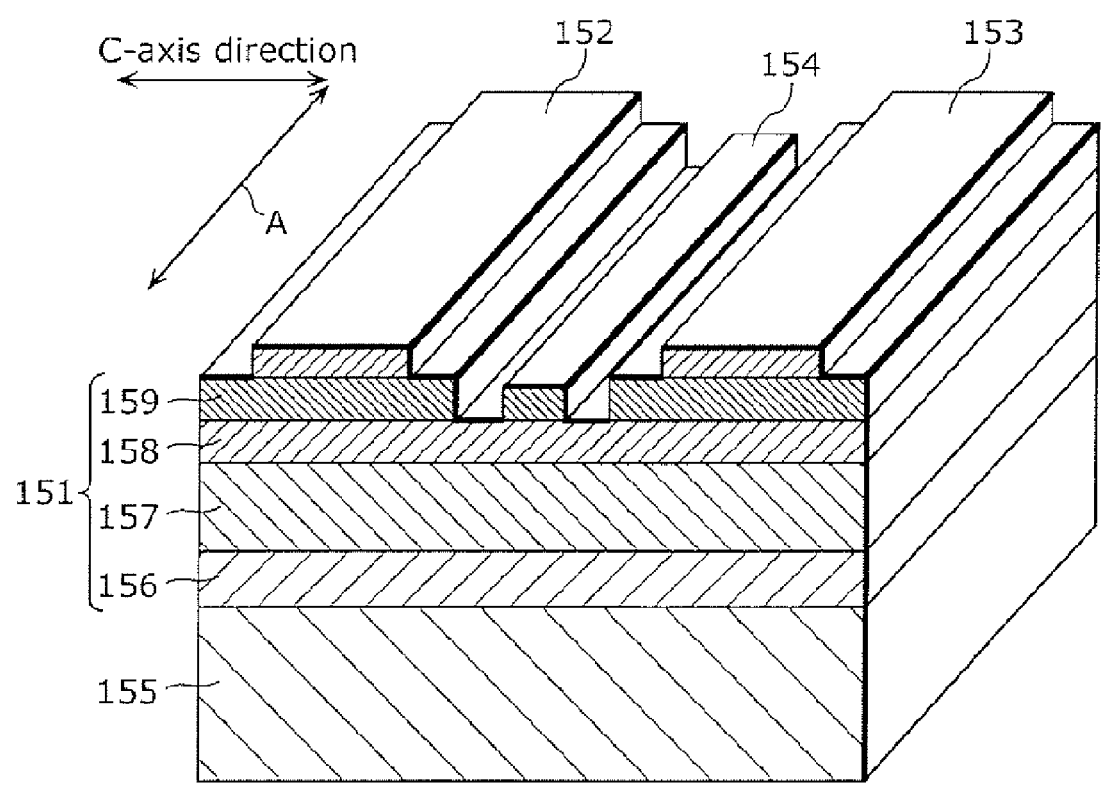
FIG. 1 is a diagonal view showing a structure of a FET according to a first embodiment of the present invention.

FIG. 1 is a diagonal view showing a structure of a field effect transistor (FET) according to the first embodiment of the present invention.

The FET according to the present embodiment is a High Electron Mobility Transistor (HEMT) having a so-called recess structure and includes: a single crystal substrate 155; a semiconductor layer 151 which is made of a hexagonal crystal with 6 mm symmetry, being In(x)Al(y)Ga(z)N(1−x−y−z) where 0≦x, y, z≦1 and x+y+z=1, and x, y, and z are not simultaneously 0, and is formed on the main surface of the single crystal substrate 155 by an epitaxial growth method such as Metal Organic Chemical Vapor Deposition method (MOCVD method); and a source electrode 152, a drain electrode 153, and a gate electrode 154 which are formed on the main surface of the semiconductor layer 151.

The single crystal substrate 155 may be, for example, a sapphire substrate having an R-plane as the main surface, a SiC substrate having an A-plane such as a (11-20) plane as the main surface, or an AlN substrate having the A plane such as the (11-20) plane as the main surface.

The semiconductor layer 151 includes a buffer layer 156, an i-type first nitride semiconductor layer 157, an n-type second nitride semiconductor layer 158, and cap layers 159 that are sequentially stacked on the single crystal substrate 155.

The main surface of the buffer layer 156 on which the first nitride semiconductor layer 157 is formed, the main surface of the first nitride semiconductor layer 157 on which the second nitride semiconductor layer 158 is formed, and the main surface of the second nitride semiconductor layer 158 on which the gate electrode 154 and the like are formed are, for instance, an A-plane or an M-plane such as a (11-20) plane or the like, and are made parallel to the C-axis. Specifically, the C-axis is included within the respective planes. For example, in the case where the single crystal substrate 155 is a sapphire substrate or the like and the main surface of said substrate is an R plane, the first nitride semiconductor layer 157 and the second nitride semiconductor layer 158 having main surfaces as indicated by pattern 1 in the following table 1 are formed. In the case where the single crystal substrate 155 is an SiC substrate, an AlN substrate, a GaN substrate or the like and the main surface of said substrate is an M plane or an A plane, the first nitride semiconductor layer 157 and the second nitride semiconductor layer 158 having main surfaces as indicated by pattern 2 or 3 in the table 1 are formed. Specifically, in the case where the single crystal substrate 155 is a sapphire substrate having the R plane as the main surface, an AlN layer having the (11-20) plane as the main surface, a GaN layer having the (11-20) plane as the main surface, and an AlGaN layer having the (11-20) plane as the main surface, which are sequentially stacked on the sapphire substrate having the R-plane as the main surface, are formed respectively as the buffer layer 156, the first nitride semiconductor layer 157 and the second nitride semiconductor layer 158.

TABLE 1

|  | Substrate | First semiconductor layer | Second semiconductor layer |
| --- | --- | --- | --- |
| Pattern 1 | R plane | A plane | A plane |
| Pattern 2 | M plane | M plane | M plane |
| Pattern 3 | A plane | A plane | A plane |

The cap layers 159 are formed on the portions of the second nitride semiconductor layer 158 except the portion of the second nitride semiconductor layer 158 near the gate electrode 154 so that a portion of the second nitride semiconductor layer 158 on which the gate electrode 154 is formed is exposed to a surface.

Figure 2:
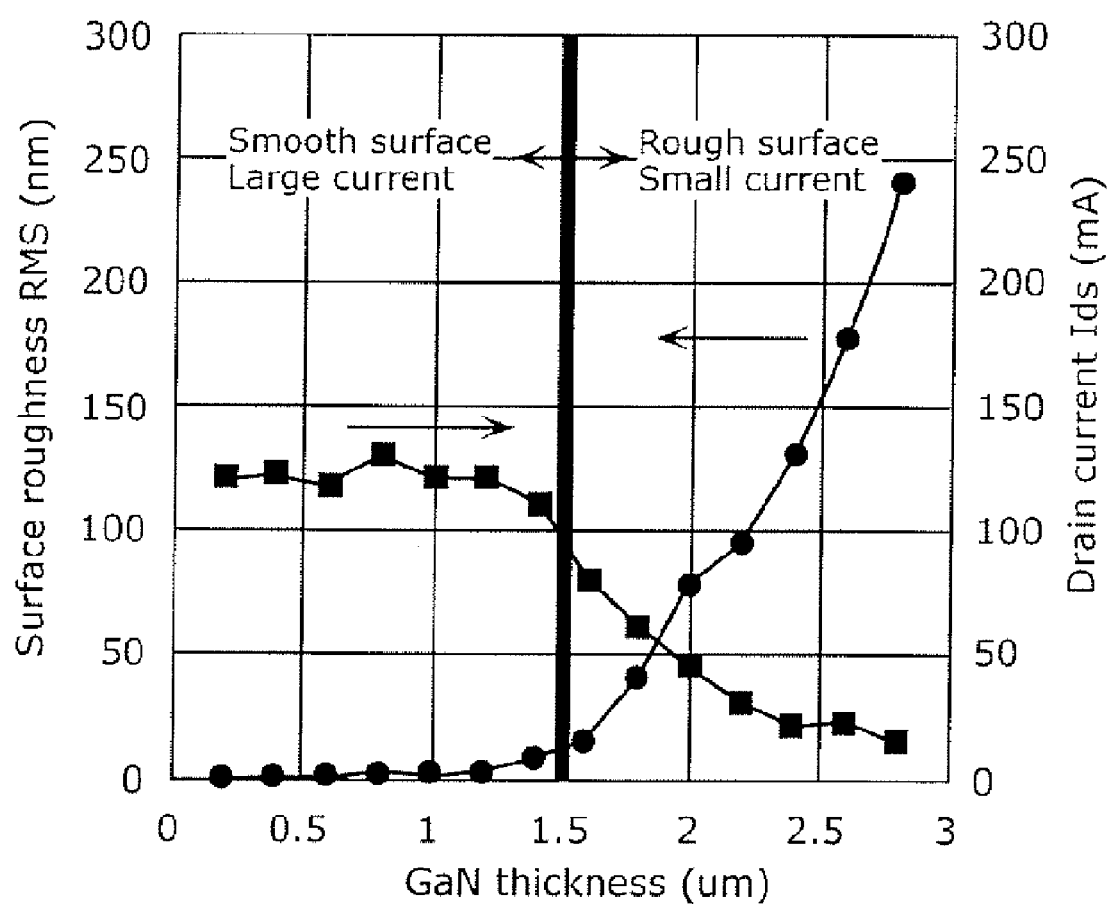
FIG. 2 is a diagram showing a dependence of a roughness of a wafer surface and a drain current value on a GaN film thickness in the FET according to the present embodiment.
Figure 3:
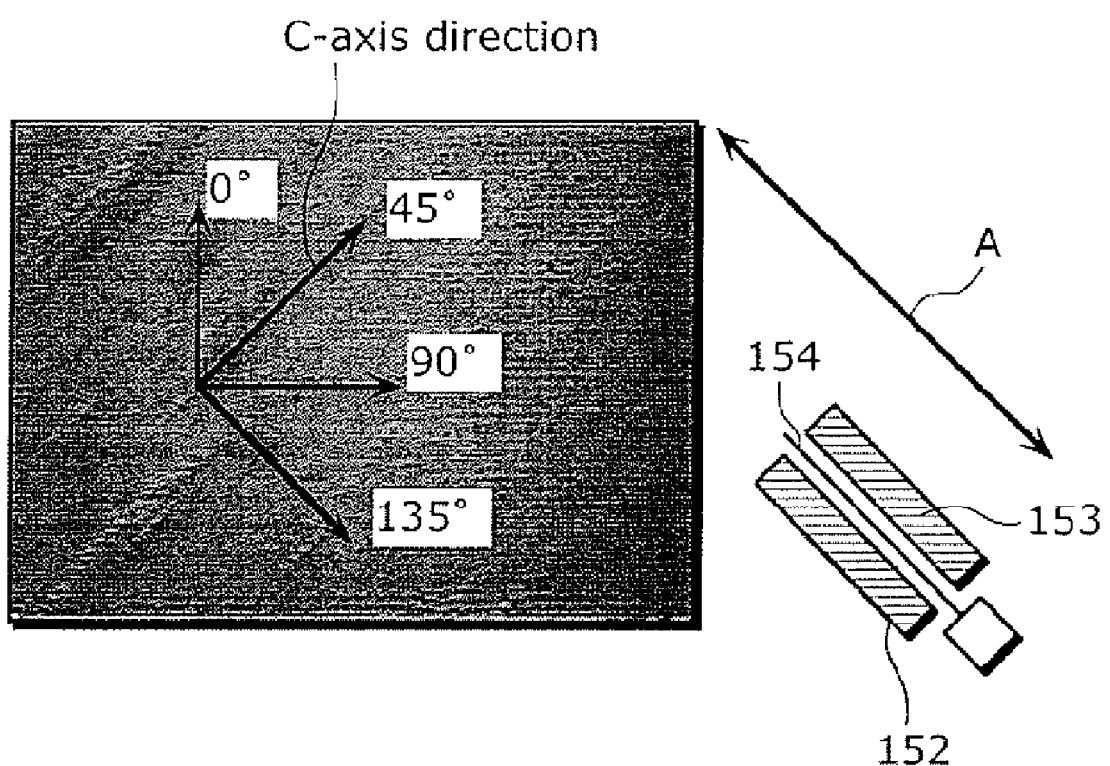
FIG. 3 is a diagram showing a relationship between a surface morphology of an AlGaN layer and a length direction of a gate electrode in the FET according to the present embodiment.

The film thickness of the first nitride semiconductor layer 157 is set to be 1.5 μm or less. This is based on the following reason that, as indicated in FIG. 2 showing a dependence of a surface roughness and drain current on the film thickness of the GaN layer as the first nitride semiconductor layer 157, when the film thickness of the first nitride semiconductor layer 157 becomes greater than 1.5 μm, rapid deterioration of the surface morphology of the first nitride semiconductor layer 157 is caused decreasing the drain current so that it becomes difficult to obtain good device characteristics. Here, a portion of the first nitride semiconductor 157, in particular, an interface between the first nitride semiconductor layer 157 and the second nitride semiconductor layer 158 is doped with n-type impurities such as Si for example. Accordingly, the drain current can be increased and the performance of the FET can be further improved. In addition, as indicated in FIG. 3 which shows a state of a surface of the AlGaN layer as the second nitride semiconductor layer 158 having the (11-20) plane as the main surface, surface morphology streaked in the C-axis direction is formed on the surface of the nitride semiconductor layer. When carriers run toward a direction orthogonal to the streaks of the nitride semiconductor layer, the carriers are diffusely scattered. However, when they run parallel to the streaks, the scattering is prevented. Therefore, the gate electrode 154 is formed so that the length direction of the gate electrode 154 (A direction in FIG. 3), which is orthogonal to the alignment direction of the source electrode 152 and the drain electrode 153, is orthogonal to the streaks which run toward the direction of C-axis on the surface of the nitride semiconductor layer. Accordingly, the decreases in carrier mobility and drain current are prevented. Here, the FET does not operate as a transistor when the film thickness of the first nitride semiconductor layer 157 is less than 0.1 μm. Therefore, it is preferred that the film thickness of the first nitride semiconductor layer 157 is set to be 0 μm or greater.

Figure 4:
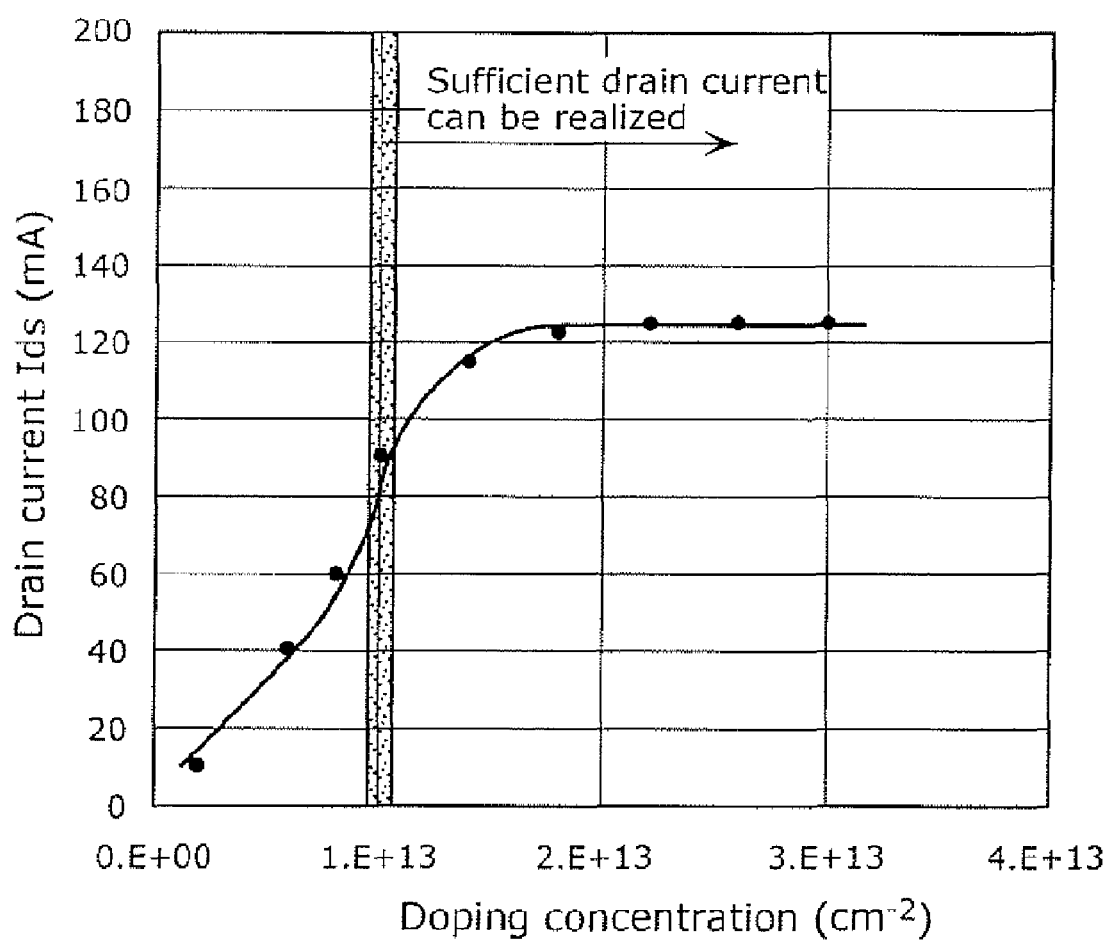
FIG. 4 is a diagram showing a dependence of drain current on a doping concentration according to the present embodiment.

The second nitride semiconductor layer 158 is made or a second nitride semiconductor having a greater band gap than that of the first nitride semiconductor which constitutes the first nitride semiconductor layer 157. A heterojunction is formed between the second nitride semiconductor layer 158 and the first nitride semiconductor layer 157. Here, a portion of the second nitride semiconductor layer 158 is doped with n-type impurities such as Si for example at a dose of $1 \times 10^{13}$ ($cm^{-2}$) or more so that the product of the impurity concentration and the thickness of the doping layer is obtained as $1 \times 10^{13}$ ($cm^{-2}$) or more. Compared with a standard doping concentration for the FET using a heterojunction having the C-plane, this doping concentration is very high. However, with the FET using the heterojunction having a plane including the C-axis in which carriers are not polarized and their mobility is low, as indicated in FIG. 4 showing a dependence of drain current on the doping concentration, the drain current significantly increases at the doping concentration of $1 \times 10^{13}$ ($cm^{-2}$). Therefore, it is necessary to set the doping concentration to be $1 \times 10^{13}$ ($cm^{-2}$) or more. Here, impurities are started to be precipitated when the doping concentration is higher than $1 \times 10^{13}$ ($cm^{-2}$) so that it is preferred to set the doping concentration to be $1 \times 10^{13}$ ($cm^{-2}$) or less.

Figure 5:
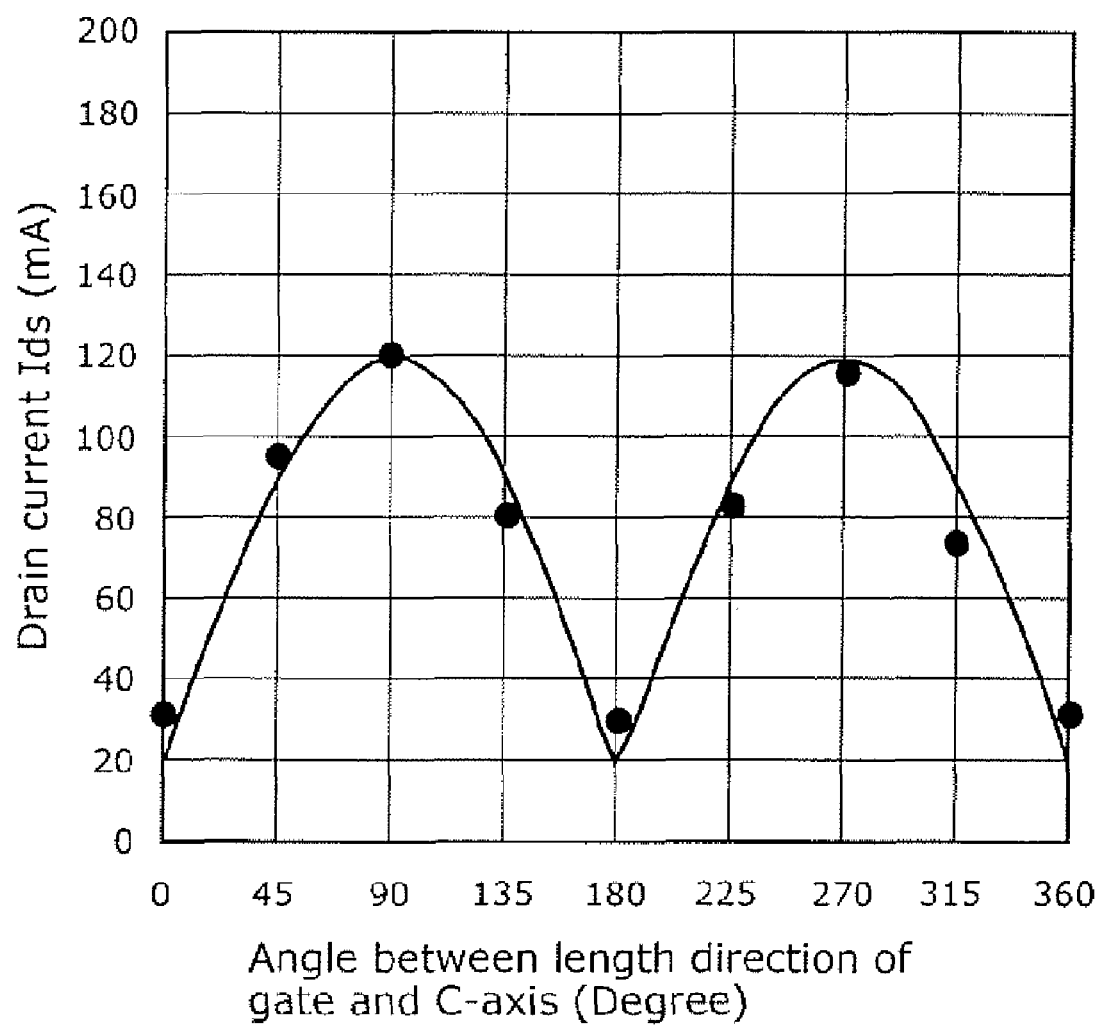
FIG. 5 is a diagram showing a dependence of the drain current on a direction of the gate electrode in the FET according to the present embodiment.

The gate electrode 154 is formed on the second nitride semiconductor layer 158 by Pd/Au deposition and lift-off, for example. Here, as indicated in FIG. 5 showing a dependency of drain current on a direction of the gate electrode 154, the drain current reaches its maximum value when the length direction of the gate electrode 154 (A direction in FIG. 1) is orthogonal to the C-axis direction in the first nitride semiconductor layer 157 and the second nitride semiconductor layer 158. Therefore, the length direction of the gate electrode 154 is aligned so as to be vertical to the C-axis direction in the first nitride semiconductor layer 157 and the second nitride semiconductor layer 158. Consequently, positive and negative types of piezo charge are respectively generated locally in the recess side walls, namely in the portions positioned below the sides of the gate electrode 154, and the speed of electrons which run through a channel is increased due to the polarized charge. Therefore, a high-speed FET can be realized. This is resulted from a stress generated in a direction vertical to the length direction of the gate electrode 154 by forming the gate electrode 154 on the surface of the semiconductor layer 151. In other words, this is resulted from that piezo charge is generated locally in the case where the semiconductor layer 151 is made of a hexagonal crystal with 6 mm symmetry and the direction of stress added to the semiconductor layer 151 is parallel to the C-axis direction in the first nitride semiconductor layer 157 and the second nitride semiconductor layer 158. It should be noted that the direction of an electric field (piezo electric field) caused by the piezo charge which is generated locally matches with the direction from the drain electrode 153 toward the source electrode 152.

The source electrode 152 and the drain electrode 153 are formed on the cap layer 159 by Ti/Al deposition and lift-off, for example.

Figure 6A:
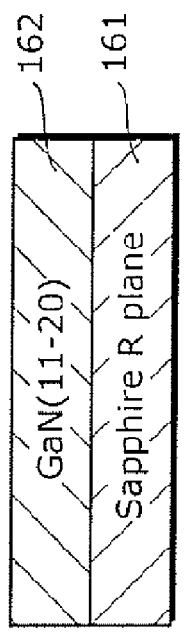
FIG. 6A is a schematic cross-sectional view of the FET according to the present embodiment.
Figure 6B:
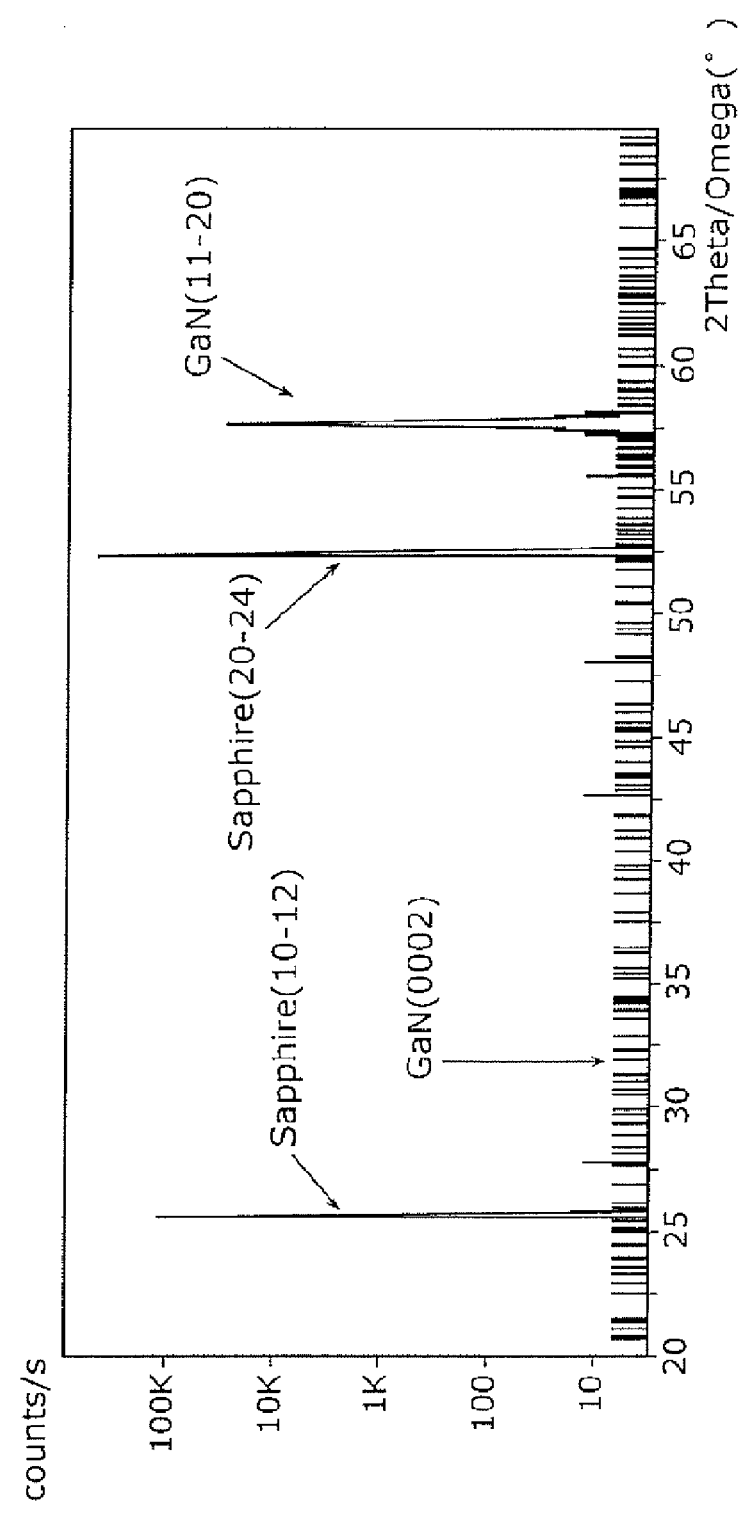
FIG. 6B is a diagram showing a result of evaluating a GaN layer by an X ray diffraction in the FET according to the present embodiment.

In the FET having the aforementioned structure, as shown in FIG. 6A, when the GaN layer 162 as the first nitride semiconductor layer 157 having the (11-20) plane as the main surface is epitaxially grown using Metal Organic Chemical Vapor Deposition method (MOCVD method) on the sapphire substrate 161 as the single crystal substrate 155 having the R plane as the main surface, a GaN(11-20) plane grows on the R-plane of the sapphire substrate 162 as indicated in FIG. 6B which shows a result of evaluating the GaN layer 162 by an X ray diffraction.

Figures 7A, 7B, 7C:
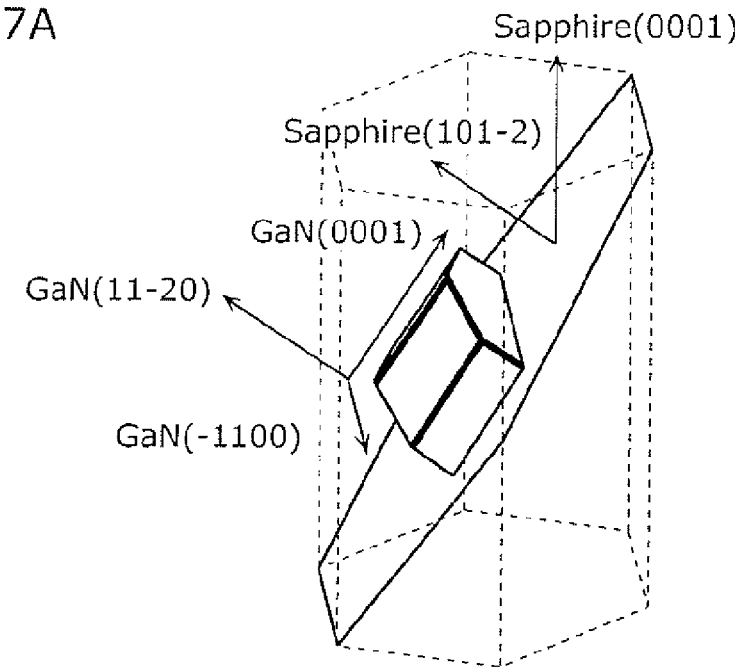
FIG. 7A is a diagram showing plane directions of a crystal.
FIG. 7B to 7C are diagrams, each of which shows a lattice spacing in a (−1100) direction and a (11-20) direction.

Furthermore, the crystallinity of the GaN layer is significantly improved in the case where an AlN layer as the buffer layer 156 having a film thickness of 500 nm for example is inserted between the sapphire substrate as the single crystal substrate 155 having the R-plane as the main surface and the GaN layer as the first nitride semiconductor layer 157 having the (11-20) plane as the main surface. The effect obtained from this insertion of the AlN layer is overwhelmingly greater than the effect obtained from an insertion of the AlN layer between the GaN layer and the sapphire substrate having the C-plane as the main surface. This is resulted from that, as shown in FIGS. 7A, 7B and 7C, when the GaN layer is grown on the sapphire substrate having the R-plane as the main surface instead of the C-plane, the lattice spacing in the (−1100) direction of GaN becomes in order of the sapphire substrate, the AlN layer and the GaN layer, so that the lattice mismatch between the sapphire substrate and the GaN layer is decreased. This effect is the fact found for the first time through experiments made by the inventors of the present invention et al.

Furthermore, in the case where the AlGaN layer as the second nitride semiconductor layer 158 having the film thickness of 25 nm for example is grown on the GaN layer as the first nitride semiconductor layer 157 having the (11-20) plane as the main surface, the main surface of the AlGaN layer also becomes the (11-20) plane due to the epitaxial relationship.

As described in the above, the heterojunction having the (11-20) plane is formed by stacking the first nitride semiconductor layer 157 and the second nitride semiconductor layer 158 on the single crystal substrate 155 having the R-plane as the main surface. Consequently, the number of carriers to be generated in the heterojunction due to the polarization is decreased so that the sheet carrier concentration in the heterojunction can be decreased. In other words, the nitride material originally has a large spontaneous polarization in the C-axis direction and a large polarization due to piezo effect is generated because the nitride material expands and contracts in the C-axis direction. Therefore, a great number of carriers are accumulated in the heterojunction having the C-plane. However, the formation of the heterojunction having the (11-20) plane can prevent the aforementioned carrier accumulation.

Figure 8:
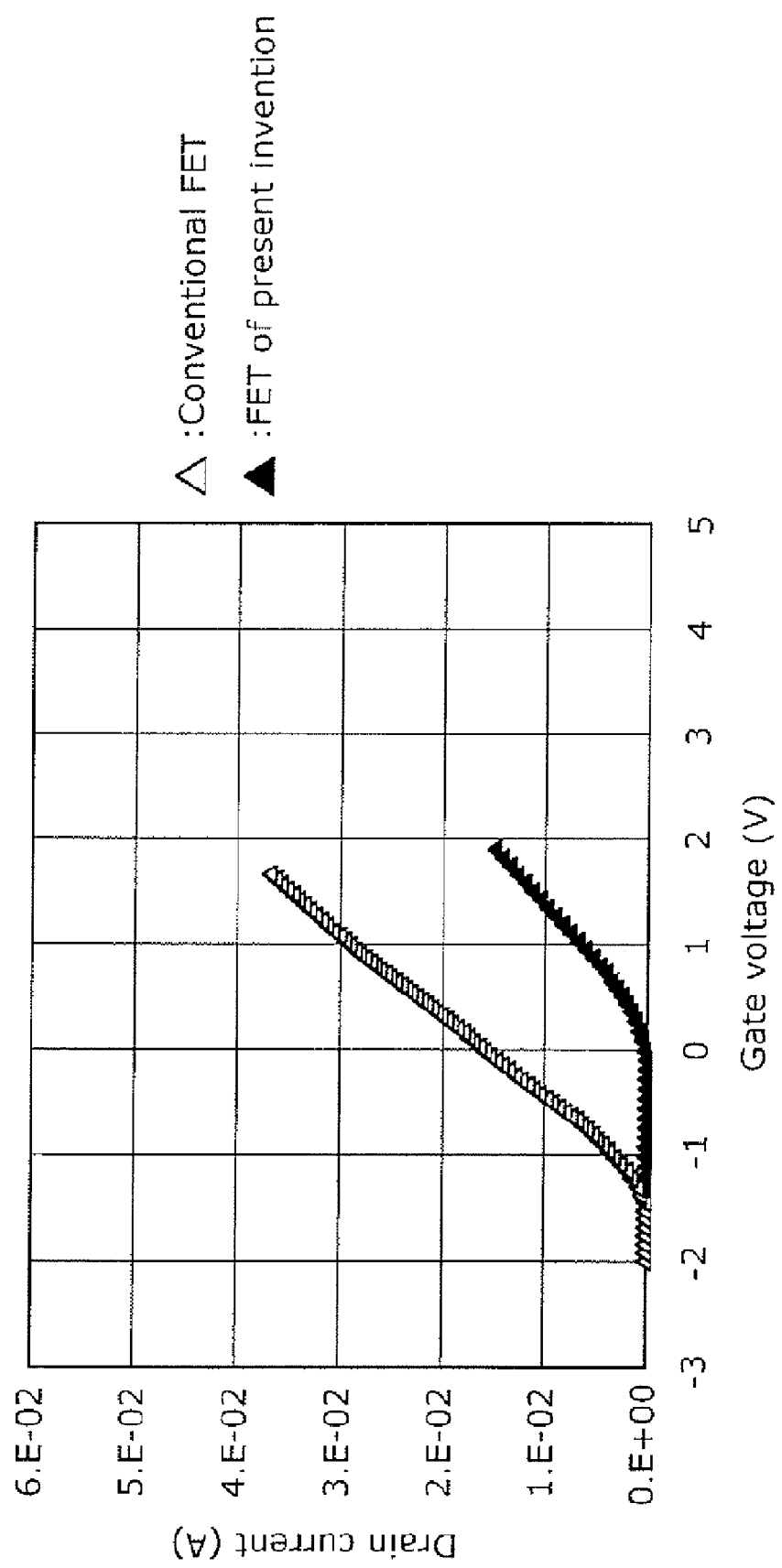
FIG. 8 is a diagram showing current-voltage characteristics (I-V characteristics) of the FET according to the present embodiment.

As described in the above, according to the FET of the present embodiment, in contrast with the conventional FET using the heterojunction having the C-plane, the highly-concentrated sheet carriers are not accumulated in a heterointerface so that the concentration of two-dimensional electron gas in the heterointerface can be reduced, Specifically, the pinch-off voltage can be precisely controlled and a normally-off type FET, which is different from the conventional FET using the heterojunction having the C-plane as shown in the current-voltage characteristics (I-V characteristics) indicated in FIG. 8, can be realized.

Furthermore, since the FET of the present embodiment has a recess structure, the on-resistance can be significantly reduced. Whereas a great number of carriers are accumulated in the heterojunction having the C-plane, carriers are rarely accumulated in the heterojunction having the plane including the C-axis such as an A-plane or an M-plane. Therefore, the on-resistance of the FET according to the present embodiment is very high. Accordingly, the effect of reducing the on-resistance by the recess structure is very high compared to the case of the FET having low on-resistance.

Second Embodiment

Figure 9:
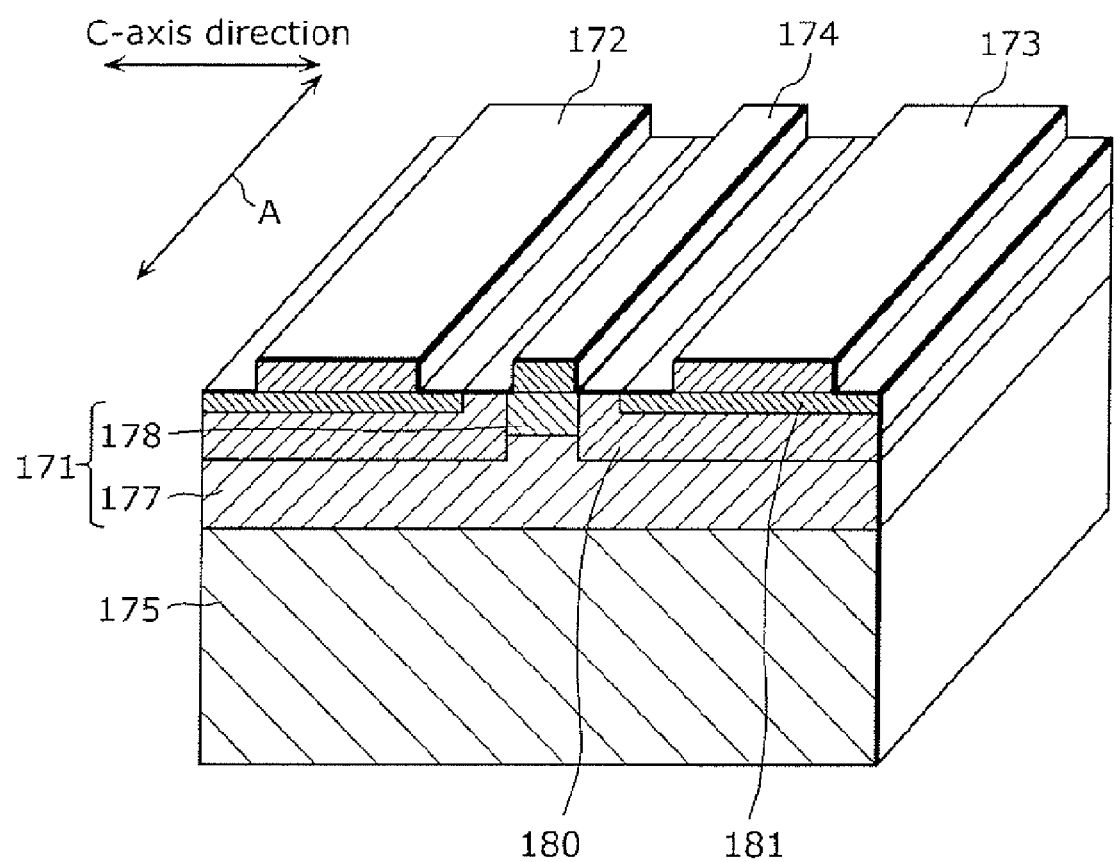
FIG. 9 is a diagonal view showing a structure of a FET according to a second embodiment of the present invention.

FIG. 9 is a diagonal view showing a structure of a Field Effect Transistor (FET) according to the second embodiment of the present invention.

The FET according to the present embodiment is a High Electron Mobility Transistor (HEMT) and includes: a single crystal substrate 175; a semiconductor layer 171 which is made of a hexagonal crystal with 6 mm symmetry, being In(x)Al(y)Ga(z)N(1−x−y−z) where $0 \leq x, y, z \leq 1$, $x+y+z=1$, and x, y, and z are not simultaneously 0, and which is formed on the main surface of the single crystal substrate 175 by epitaxial method such as Metal Organic Chemical Vapor Deposition method; and a source electrode 172, a drain electrode 173, and a gate electrode 174 which are formed on the main surface of the semiconductor layer 171.

The single crystal substrate 175 may be, for example, a sapphire substrate having an R-plane as the main surface, a SiC substrate having an A-plane such as a (11-20) plane as the main surface, or a GaN substrate having the A-plane such as the (11-20) plane as the main surface.

The semiconductor layer 171 includes an i-type first nitride semiconductor layer 177 and an n-type second nitride semiconductor layer 178 that are sequentially stacked on the single crystal substrate 175. Here, n⁻ layers 180 are formed in the portions of the first nitride semiconductor layer 177 and the second nitride semiconductor layer 178 other than the portions immediately below the gate electrode 174, by implanting ions of n-type impurities such as Si for example at an acceleration voltage of 10 keV and a dose of $1\times10^{13}$ (cm$^{-2}$). Furthermore, n⁺ layers 181, which have a higher impurity concentration than that of the n⁻ layer 180, are formed in the portions of the n⁻ layers 180 immediately below the source electrode 172 and the drain electrode 173, by implanting ions of highly concentrated n-type impurities at an acceleration voltage of 10 keV and a dose of $2\times10^{13}$ (cm$^{-2}$) for example.

The main surface of the first nitride semiconductor layer 177 on which the second nitride semiconductor layer 178 is formed, and the main surface of the second nitride semiconductor layer 178 on which the gate electrode 174 and the like are formed are, for instance, an A-plane or an M-plane such as a (11-20) plane, and are made parallel to the C-axis. Namely, the C-axis is included within the respective planes. Specifically, a GaN layer having the (11-20) plane as the main surface and an AlGaN layer having the (11-20) plane as the main surface, which are sequentially stacked on the sapphire substrate having an R-plane as the main surface, are used respectively as the first nitride semiconductor layer 177 and the second nitride semiconductor layer 178.

The film thickness of the first nitride semiconductor layer 177 is set to be 1.5 μm or less. Here, portions of the first nitride semiconductor layer 177 and the second nitride semiconductor layer 178 are doped with n-type impurities such as Si.

The second nitride semiconductor layer 178 is made of a second nitride semiconductor having a greater band gap than that of the first nitride semiconductor which constitutes the first nitride semiconductor layer 177. A heterojunction is formed between the first nitride semiconductor layer 177 and the second nitride semiconductor layer 178. For example, in the case where the first nitride semiconductor layer 177 is made of GaN having the (11-20) plane as the main surface, the second nitride semiconductor layer 178 is made of AlGaN with the film thickness of 25 nm having the (11-20) plane as the main surface and with a band gap greater than that of GaN. Here, a portion of the second nitride semiconductor layer 178 is doped with n-type impurities such as Si for example at a dose of $1\times10^{13}$ (cm$^{-2}$) or more so that the product of the impurity concentration and the thickness of the doping layer is obtained as $1\times10^{13}$ (cm$^{-2}$).

The gate electrode 174 is formed on the second nitride semiconductor layer 178 by Pd/Au deposition and lift-off for example. Here, the gate electrode 174 is formed so that the length direction of the gate electrode 174 (A direction in FIG. 9), which is orthogonal to the alignment direction of the source electrode 172 and the drain electrode 173, is orthogonal to the streaks which run toward the direction of C-axis on the surface of the nitride semiconductor layer. Furthermore, the gate electrode 174 is formed so that the length direction of the gate electrode 174 is orthogonal to the direction of C-axis on the first nitride semiconductor layer 177 and the second nitride semiconductor layer 178.

As described in the above, according to the FET of the present embodiment, a normally-off type FET which can precisely control the pinch-off voltage can be realized based on the same reason described for the FET in the first embodiment.

Figures 10A, 10B:
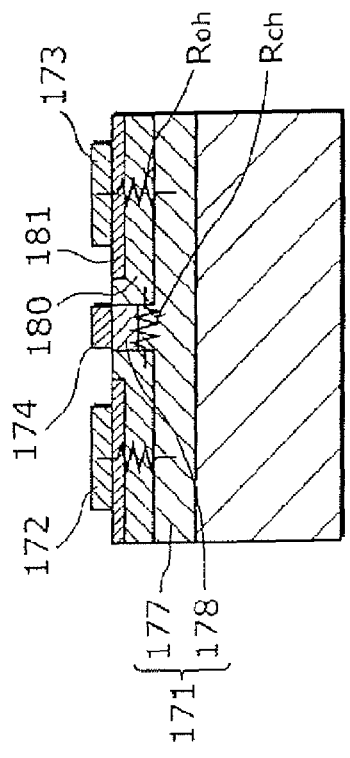
FIG. 10A to 10B are diagrams, each of which shows electric characteristics of the FET according to the present embodiment.

Furthermore, according to the FET of the present embodiment, as shown in FIG. 10A, n⁻ layers 180 are formed in the portions of the semiconductor layer 171 other than the portions immediately below the gate electrode 174 by implanting ions of n-type impurities. Therefore, an impurity doping, which will not be realized by the epitaxial growth, can be obtained, and the resistance in the semiconductor layer 171 between the gate electrode 174 and the ohmic electrode can be reduced by reducing the channel resistance $R_{ch}$ as shown in FIG. 10B so that on-resistance $R_{on}$ of the FET can be reduced by about ten percent.

Furthermore, according to the FET of the present embodiment, as shown in FIG. 10A, n⁺ layers 181 are formed in the portions of the second nitride semiconductor layer 178 immediately below the source electrode 172 and the drain electrode 173 by implanting ions of highly concentrated n-type impurities. Therefore, an impurity doping which will not be realized by the epitaxial growth can be obtained, and as shown in FIG. 10B, the resistance $R_{oh}$, in an ohmic region, namely the contact resistance of the source electrode 172 and the drain electrode 173, can be reduced by ten percent so that on-resistance $R_{on}$ of the FET can be reduced as much as twenty percent in total.

Although the FET of the present invention was described based on the aforementioned embodiments, the present invention is not restricted to the scope of the embodiments. Those skilled in the art will readily appreciate that many modifications are possible in the embodiments without materially departing from the novel teachings and advantages of this invention. Accordingly, all such modifications are intended to be included within the scope of this invention.

For example, in the FET of the aforementioned embodiments, it was described that the film thickness of the first nitride semiconductor layer 157 is set to be 1.5 μm or less and the doping concentration of the second nitride semiconductor layer 158 is set to be $1\times10^{13}$ (cm$^{-2}$) or more. However, if a FET is manufactured so as to fulfill one of the aforementioned conditions, the decrease in drain current in the FET can be prevented so that the FET may be manufactured so as to satisfy only one of the aforementioned conditions.

INDUSTRIAL APPLICABILITY

The present invention is applicable to a field effective transistor and particularly to a nitride transistor or the like intended for power switching as represented by an inverter used for an electric vehicle or a home electric appliance.

What is claimed is:

1. A field effect transistor, comprising:
   a first semiconductor layer which is made of a first hexagonal crystal with 6 mm symmetry and has a main surface including a C-axis of the first hexagonal crystal;
   a second semiconductor layer which is formed directly on the main surface of said first semiconductor layer and is made of a second hexagonal crystal with 6 mm symmetry having a band gap different from a band gap of the first hexagonal crystal;
   a gate electrode;
   a source electrode; and
   a drain electrode,
   wherein said gate electrode, said source electrode and said drain electrode are formed on said second semiconductor layer,
   a film thickness of said first semiconductor layer is 1.5 µM or less,
   said second semiconductor layer has an n-type conductivity, and
   a longitudinal direction of said gate electrode is orthogonal to the C-axis and to an alignment direction of said source electrode and said drain electrode.

2. The field effect transistor according to claim 1, wherein said second semiconductor layer is doped with impurities at a dose of $1 \times 10^{13}$ cm$^{-2}$ or more.

3. The field effect transistor according to claim 1 further comprises:
   a substrate having an R-plane as a main surface,
   wherein said first semiconductor layer is a semiconductor layer, which is positioned on the main surface of said substrate and has an A-plane as a main surface, and
   said second semiconductor layer is a semiconductor layer having an A-plane as a main surface.

4. The field effect transistor according to claim 1 further comprises:
   a substrate having an A-plane as a main surface,
   wherein said first semiconductor layer is a semiconductor layer, which is positioned on the main surface of said substrate and has an A-plane as a main surface, and
   said second semiconductor layer is a semiconductor layer having an A-plane as a main surface.

5. The field effect transistor according to claim 1 further comprises:
   a substrate having an M-plane as a main surface,
   wherein said first semiconductor layer is a semiconductor layer, which is positioned on the main surface of said substrate and has an M-plane as a main surface, and
   said second semiconductor layer is a semiconductor layer having an M-plane as a main surface.

6. The field effect transistor according to claim 1 further comprising:
   a sapphire substrate having an R-plane as a main surface; and
   an AlN layer which is formed between said first semiconductor layer and said sapphire substrate so as to be positioned on the main surface of said sapphire substrate,
   wherein said second semiconductor layer is a GaN layer.

7. The field effect transistor according to claim 1,
   wherein first n-type regions are formed in a region of said second semiconductor layer other than a region of said second semiconductor layer immediately below said gate electrode, as a result of implanting ions of n-type impurities.

8. The field effect transistor according to claim 7,
   wherein second n-type regions are formed in a region of said first n-type regions immediately below said source electrode and said drain electrode.

9. The field effect transistor according to claim 1,
   wherein said field effect transistor has a recess structure.

10. The field effect transistor according to claim 1,
    wherein a portion of said first semiconductor layer is doped with n-type impurities.

11. The field effect transistor according to claim 1,
    wherein a pinch-off voltage of the field effect transistor can be precisely controlled, and the field effect transistor is normally off.

12. A field effect transistor, comprising:
    a first semiconductor layer which is made of a first hexagonal crystal with 6 mm symmetry and has a main surface including a C-axis of the first hexagonal crystal;
    a second semiconductor layer which is formed directly on the main surface of said first semiconductor layer and is made of a second hexagonal crystal with 6 mm symmetry having a band gap different from a band gap of the first hexagonal crystal;
    a gate electrode;
    a source electrode; and
    a drain electrode,
    wherein said gate electrode, said source electrode and said drain electrode are formed on said second semiconductor layer,
    said second semiconductor layer is doped with impurities at a dose of $1 \times 10^{13}$ cm$^{-2}$ or more,
    said second semiconductor layer has an n-type conductivity, and
    a longitudinal direction of said gate electrode is orthogonal to the C-axis and to an alignment direction of said source electrode and said drain electrode.

13. The field effect transistor according to claim 12,
    wherein a film thickness of said first semiconductor layer is 1.5 µm or less.

14. The field effect transistor according to claim 12 further comprises:
    a substrate having an R-plane as a main surface,
    wherein said first semiconductor layer is a semiconductor layer, which is positioned on the main surface of said substrate and has an A-plane as a main surface, and
    said second semiconductor layer is a semiconductor layer having an A-plane as a main surface.

15. The field effect transistor according to claim 12 further comprises:
    a substrate having an A-plane as a main surface,
    wherein said first semiconductor layer is a semiconductor layer, which is positioned on the main surface of said substrate and has an A-plane as a main surface, and
    said second semiconductor layer is a semiconductor layer having an A-plane as a main surface.

16. The field effect transistor according to claim 12 further comprises:
    a substrate having an M-plane as a main surface,
    wherein said first semiconductor layer is a semiconductor layer, which is positioned on the main surface of said substrate and has an M-plane as a main surface, and said second semiconductor layer is a semiconductor layer having an M-plane as a main surface.

17. The field effect transistor according to claim 12 further comprising:
a sapphire substrate having an R-plane as a main surface; and
an AlN layer which is formed between said first semiconductor layer and said sapphire substrate so as to be positioned on the main surface of said sapphire substrate,
wherein said second semiconductor layer is a GaN layer.

18. The field effect transistor according to claim 12,
wherein first n-type regions are formed in a region of said second semiconductor layer other than a region of said second semiconductor layer immediately below said gate electrode, as a result of implanting ions of n-type impurities.

19. The field effect transistor according to claim 18,
wherein second n-type regions are formed in a region of said first n-type regions immediately below said source electrode and said drain electrode.

20. The field effect transistor according to claim 12,
wherein said field effect transistor has a recess structure.

21. The field effect transistor according to claim 12,
wherein a portion of said first semiconductor layer is doped with n-type impurities.

22. The field effect transistor according to claim 12,
wherein a pinch-off voltage of the field effect transistor can be precisely controlled, and the field effect transistor is normally off.

23. A field effect transistor, comprising:
a first semiconductor layer which is made of a first hexagonal crystal with 6 mm symmetry and has a main surface including a C-axis of the first hexagonal crystal;
a second semiconductor layer which is formed directly on the main surface of said first semiconductor layer and is made of a second hexagonal crystal with 6 mm symmetry having a band gap different from a band gap of the first hexagonal crystal;
a gate electrode;
a source electrode; and
a drain electrode;
wherein said gate electrode, said source electrode and said drain electrode are formed on said second semiconductor layer,
said second semiconductor layer has an n-type conductivity, and
a longitudinal direction of said gate electrode is orthogonal to the C-axis and to an alignment direction of said source electrode and said drain electrode.

24. The field effect transistor according to claim 23,
wherein said second semiconductor layer is doped with impurities at a dose of $1\times10^{13}$ cm$^{-2}$ or more.

* * * * *